United States Patent
Wu et al.

(10) Patent No.: US 11,971,451 B2
(45) Date of Patent: Apr. 30, 2024

(54) METHOD FOR DETERMINING PARAMETERS IN ON-WAFER CALIBRATION PIECE MODEL

(71) Applicant: THE 13TH RESEARCH INSTITUTE OF CHINA ELECTRONICS TECHNOLOGY GROUP CORPORATION, Shijiazhuang (CN)

(72) Inventors: Aihua Wu, Shijiazhuang (CN); Yibang Wang, Shijiazhuang (CN); Faguo Liang, Shijiazhuang (CN); Chen Liu, Shijiazhuang (CN); Ye Huo, Shijiazhuang (CN); Peng Luan, Shijiazhuang (CN); Jing Sun, Shijiazhuang (CN); Yanli Li, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 336 days.

(21) Appl. No.: 17/550,487

(22) Filed: Dec. 14, 2021

(65) Prior Publication Data

US 2022/0099736 A1 Mar. 31, 2022

Related U.S. Application Data

(63) Continuation of application No. PCT/CN2021/096852, filed on May 28, 2021.

(30) Foreign Application Priority Data

Aug. 14, 2020 (CN) .......................... 202010819042.3
Aug. 14, 2020 (CN) .......................... 202010820386.6
Aug. 14, 2020 (CN) .......................... 202010820390.2

(51) Int. Cl.
G01R 31/319 (2006.01)
G01R 27/28 (2006.01)
G01R 31/3185 (2006.01)

(52) U.S. Cl.
CPC .. *G01R 31/3191* (2013.01); *G01R 31/318511* (2013.01)

(58) Field of Classification Search
CPC ...... G01R 35/005; G01R 27/28; G01R 27/32; G01R 1/06772; G01R 1/07342; G01R 35/00; G01R 31/3191
See application file for complete search history.

(56) References Cited

U.S. PATENT DOCUMENTS

| 4,858,160 A | 8/1989 | Strid et al. |
| 7,764,072 B2 * | 7/2010 | Strid .................. G01R 1/06772 324/149 |

(Continued)

FOREIGN PATENT DOCUMENTS

| CN | 106405462 A | 2/2017 |
| CN | 108614231 A | 10/2018 |

(Continued)

*Primary Examiner* — Jermele M Hollington
*Assistant Examiner* — Temilade S Rhodes-Vivour
(74) *Attorney, Agent, or Firm* — AP3 Law Firm PLLC

(57) ABSTRACT

A method includes: constructing an on-wafer calibration piece model set that includes one or more on-wafer calibration piece models, where each of the one or more on-wafer calibration piece models has a corresponding on-wafer calibration piece; selecting an on-wafer calibration piece model from the on-wafer calibration piece model set; measuring the on-wafer calibration piece utilizing an on-wafer S parameter measurement system that is calibrated using a multi-thread TRL calibration method in a Terahertz frequency band, to obtain an S parameter of the on-wafer calibration piece; and calculating a plurality of different parameters that represent crosstalk of calibration pieces in the on-wafer calibration piece model, according to an admittance calculated according to the S parameter and an admittance formula corresponding to the on-wafer calibration piece model.

15 Claims, 5 Drawing Sheets

(56) References Cited

U.S. PATENT DOCUMENTS

| | | | | |
|---|---|---|---|---|
| 8,798,953 B2* | 8/2014 | Huang | ................ | G01R 35/005 |
| | | | | 324/638 |
| 2004/0160228 A1 | 8/2004 | Jamneala et al. | | |
| 2008/0018343 A1* | 1/2008 | Hayden | ................ | G01R 35/005 |
| | | | | 324/601 |
| 2011/0208467 A1* | 8/2011 | Tang | ................... | G01R 35/007 |
| | | | | 257/E21.585 |
| 2012/0109566 A1* | 5/2012 | Adamian | ............ | G01R 35/005 |
| | | | | 702/107 |
| 2015/0263429 A1* | 9/2015 | Vahidpour | ............ | H01Q 13/10 |
| | | | | 343/770 |

FOREIGN PATENT DOCUMENTS

| | | |
|---|---|---|
| CN | 108845280 A | 11/2018 |
| CN | 109444717 A | 3/2019 |
| CN | 110286345 A | 9/2019 |
| CN | 111142057 A | 5/2020 |

* cited by examiner

METHOD FOR DETERMINING PARAMETERS IN ON-WAFER CALIBRATION PIECE MODEL

CROSS-REFERENCE TO RELATED APPLICATIONS

This application is a continuation application of International Application No. PCT/CN 2021/096852, filed on May 28, 2021, which claims priority to Chinese Patent Application No. CN 202010819042.3, Chinese Patent Application No. CN 202010820386.6 and Chinese Patent Application No. CN 202010820390.2, all of which were filed on Aug. 14, 2020. The disclosures of the aforementioned applications are hereby incorporated herein by reference in their entireties.

TECHNICAL FIELD

The present application relates to the technical field of measurement of microwave characteristics of wafer level semiconductor devices, and in particular, a method for determining parameters in an on-wafer calibration piece model.

BACKGROUND

An "on-wafer S parameter measurement system" is widely used in the microelectronics industry. Before use, an on-wafer calibration piece needs to be used to perform vector calibration on the on-wafer S parameter measurement system. The accuracy of calibration depends on the accuracy of on-wafer calibration piece definition. Measurement models of different types of calibration pieces (such as an open-circuit calibration piece, a short-circuit calibration piece, a load calibration piece, and a straight-through calibration piece) have different values of lumped parameters. The lumped parameters generally include a delay of an offset line, a characteristic impedance, a series resistance, an inductance, a capacitance, and a direct-current resistance. How to obtain an accurate measured value of each lumped parameter in the measurement model is the key to define the calibration piece. In the prior art, the measurement model for a traditional commercial on-wafer calibration assembly has been widely used at a low frequency band or below. However, as an on-wafer test frequency increases, when the traditional measurement model is used to calibrate the on-wafer test system, the accuracy of calibration and testing decreases.

SUMMARY

These and other problems are generally solved or circumvented, and technical advantages are generally achieved, by embodiments of the present disclosure which provide a method for determining parameters in an on-wafer calibration piece model.

Technical Problems

The present application provides a method for determining parameters in an on-wafer calibration piece model, so as to solve the problem of a decrease in the accuracy of calibration and testing caused by a fact that a traditional measurement model is used in the prior art to calibrate an on-wafer test system.

Technical Solutions

The present application provides a method for determining parameters in an on-wafer calibration piece model and the method includes: constructing an on-wafer calibration piece model set, the on-wafer calibration piece model set including one or more on-wafer calibration piece models used in a Terahertz frequency band, each of the one or more on-wafer calibration piece models has a corresponding on-wafer calibration piece; selecting an on-wafer calibration model from the on-wafer calibration piece model set; in the Terahertz frequency band, using a multi-thread TRL (Thru-Reflect-Line) calibration method to calibrate an on-wafer S parameter measurement system, using the calibrated on-wafer S parameter measurement system to measure the on-wafer calibration piece, and obtaining an S parameter of the on-wafer calibration piece; calculating an admittance of the on-wafer calibration piece according to the S parameter of the on-wafer calibration piece; determining, according to the on-wafer calibration piece model corresponding to the on-wafer calibration piece, an admittance formula corresponding to the on-wafer calibration piece model; and calculating, according to the admittance and the corresponding admittance formula, a plurality of different parameters that represent crosstalk of calibration pieces in the on-wafer calibration piece model. It should be noted that the multi-thread TRL calibration method is a method provided by the NIST (National Institute of Standards and Technology) of the United States. The multi-thread TRL calibration method is widely regarded as having the highest calibration accuracy in the prior art.

Advantageous Effects of the Disclosure

The present application provides a method for determining parameters in an on-wafer calibration piece model. On the basis of an on-wafer calibration piece model, in the Terahertz frequency band, a multi-thread TRL calibration method is used to calibrate an on-wafer S parameter measurement system, and the calibrated on-wafer S parameter measurement system is used to measure an on-wafer calibration piece, thus obtaining an S parameter of the on-wafer calibration piece; an admittance of the on-wafer calibration piece is calculated according to the S parameter of the on-wafer calibration piece; an admittance formula corresponding to the on-wafer calibration piece model is determined according to the on-wafer calibration piece model corresponding to the on-wafer calibration piece; and a plurality of different parameters that represent crosstalk of calibration pieces in the on-wafer calibration piece model are calculated according to the admittance of the on-wafer calibration piece and the corresponding admittance formula. After being obtained, the parameters that represent the crosstalk can be used in calibration of an on-wafer S parameter measurement system, and the calibration has a higher accuracy. For example, the on-wafer calibration piece of the selected on-wafer calibration piece model having such calculated parameters may be used to calibrate an on-wafer S parameter measurement system, to make a more accurate calibration. When the parameters that represent the crosstalk are calculated the on-wafer calibration piece model according to the embodiments, the corresponding on-wafer calibration piece has more accurate definition. As an on-wafer test frequency increases (e.g., in the Terahertz frequency band), an on-wafer calibration piece that has more accurate definition can be used to perform vector calibration on the on-wafer S parameter measurement system with a higher accuracy, and the calibrated on-wafer S parameter measurement system thus has higher measurement accuracy. For example, an on-wafer calibration piece that has more accurate definition can be used to calibrate an on-wafer vector network analyzer, which is one kind of the S parameter measurement system, using a SOLT (Short-Open-Load-Thru) method. The on-wafer vector network analyzer will have higher measurement accuracy after being calibrated using an on-wafer calibration piece provided according the embodiments of the present application. Both the on-wafer vector network analyzer and the SOLT method are known in the art and thus are not explained here further. The present application provides a plurality of on-wafer calibration piece models. The parameters that represent crosstalk in different on-wafer calibration piece models can all be obtained by the above method. The method for determining the parameters in the on-wafer calibration piece model provided by the present application solves calibration and measurement errors caused by imperfection of an original calibration piece model in the Terahertz frequency band and can improve the test accuracy of on-wafer S parameters in the Terahertz frequency band.

BRIEF DESCRIPTION OF THE DRAWINGS

In order to describe the technical solutions in the embodiments of the present application more clearly, drawings required to be used in the existing art and the embodiments will be briefly introduced below. Apparently, the drawings described below are only some embodiments of the present disclosure. Those of ordinary skill in the art also can obtain other drawings according to these drawings without doing creative work.

DETAILED DESCRIPTION OF ILLUSTRATIVE EMBODIMENTS

In the following description, for the purpose of illustration rather than limitation, specific details such as specific system structures and technologies are proposed for a thorough understanding of the embodiments of the present application. However, it should be clear to those skilled in the art that the present application can also be implemented in other embodiments without these specific details. In other cases, detailed descriptions of well-known systems, devices, circuits, and methods are omitted to avoid unnecessary details from obstructing the description of the present application.

The technical solutions of the present application are described below through specific embodiments.

Figure 1:
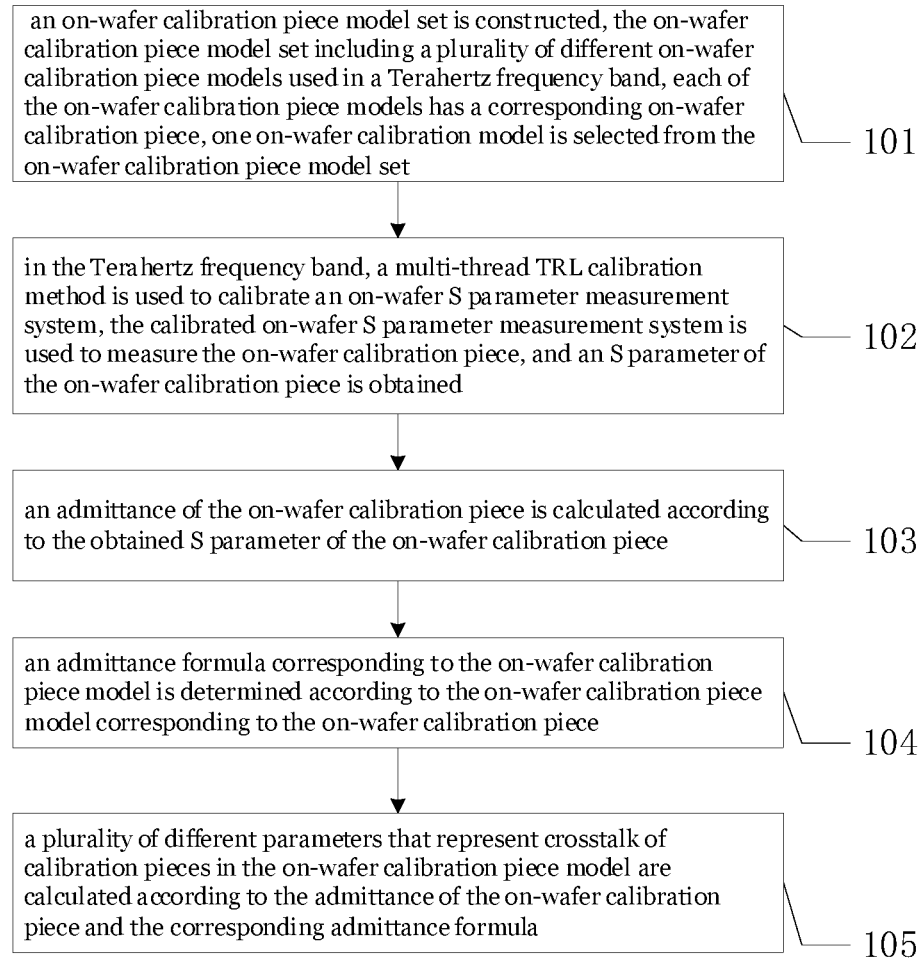
FIG. 1 is a schematic diagram of a method for determining parameters in an on-wafer calibration piece model according to one embodiment of the present application.

FIG. 1 is a schematic diagram of a method for determining parameters in an on-wafer calibration piece model provided by one embodiment of the present application. For the convenience of illustration, parts that are related to the embodiment of the present application are illustrated only. As shown in FIG. 1, the method may include the following steps.

At step 101, an on-wafer calibration piece model set is constructed, the on-wafer calibration piece model set including a plurality of different on-wafer calibration piece models used in a Terahertz frequency band, each of the on-wafer calibration piece models has a corresponding on-wafer calibration piece; one on-wafer calibration model is selected from the on-wafer calibration piece model set.

The plurality of different on-wafer calibration piece models used in the Terahertz frequency band are that a circuit formed by connecting, in series, two elements that represent crosstalk of different on-wafer calibration pieces is connected, in parallel, to two ends of an end surface of an original calibration piece model.

Figure 2:
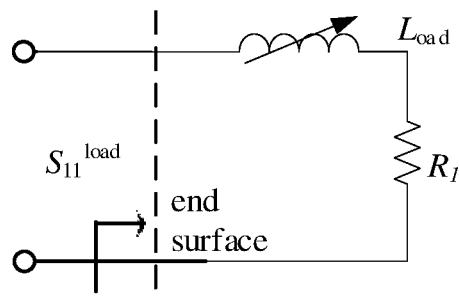
FIG. 2 is a schematic diagram of an original load calibration piece model in the prior art.
Figure 3:
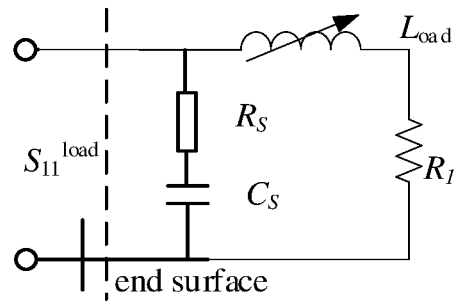
FIG. 3 is a schematic diagram of a first load calibration piece model according to embodiments of the present application and used in a Terahertz frequency band.

Optionally, FIG. 2 illustrates an original load calibration piece model in the prior art, and FIG. 3 illustrates a first load calibration piece model used in a Terahertz frequency band provided by the present application. The original load calibration piece model includes a load calibration piece inductor $L_{load}$ and a load calibration piece direct-current resistor $R_1$. One end of the load calibration piece inductor $L_{load}$ is one end of a single port of the original load calibration piece model, and the other end of the load calibration piece inductor $L_{load}$ is connected to one end of the load calibration piece direct-current resistor $R_1$. The other end of the load calibration piece direct-current resistor $R_1$ is the other end of the single port of the original load calibration piece model.

The first load calibration piece model used in the Terahertz frequency band is that a series circuit composed of a resistor $R_s$ that represents crosstalk of the load calibration piece and a capacitor $C_s$ that represents crosstalk of the load calibration piece is connected, in parallel, to two ends of the single port of the original load calibration piece model. Optionally, the first load calibration piece model includes the load calibration piece inductor $L_{load}$, the load calibration piece direct-current resistor $R_1$, the resistor $R_s$ that represents crosstalk of the load calibration piece, and the capacitor $C_s$ that represents crosstalk of the load calibration piece.

One end of the load calibration piece inductor $L_{load}$ is connected to one end of the resistor $R_s$ that represents crosstalk of the load calibration piece, thus forming one end of a single port of the first load calibration piece model. The other end of the load calibration piece inductor $L_{load}$ is connected to one end of the load calibration piece direct-current resistor $R_1$, the other end of the resistor $R_s$ that represents crosstalk of the load calibration piece is connected to one end of the capacitor $C_s$ that represents crosstalk of the load calibration piece, and the other end of the capacitor $C_s$ that represents crosstalk of the load calibration piece is connected to the other end of the load calibration piece direct-current resistor $R_1$, thus forming the other end of the single port of the first load calibration piece model.

Figure 6:
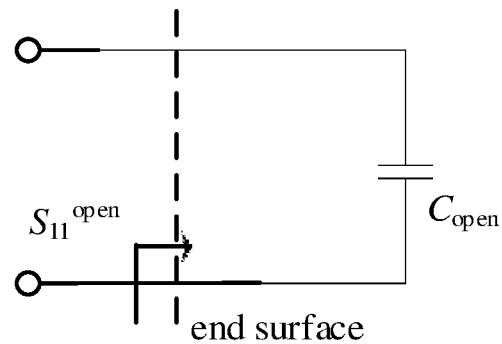
FIG. 6 is a schematic diagram of an original open circuit calibration piece model in the prior art.
Figure 7:
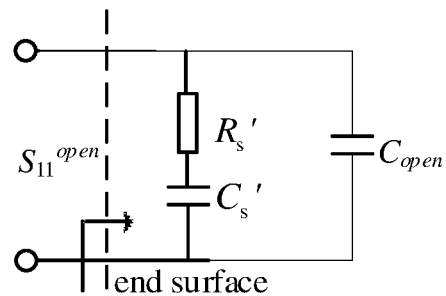
FIG. 7 is a schematic diagram of a first open circuit calibration piece model according to embodiments of the present application and used in a Terahertz frequency band.

Optionally, FIG. 6 illustrates an original open circuit calibration piece model in the prior art, and FIG. 7 illustrates a first open circuit calibration piece model used in a Terahertz frequency band provided by the present application. The original open circuit calibration piece model includes an open circuit calibration piece capacitor $C_{open}$, and two ends of the open circuit calibration piece capacitor $C_{open}$ are respectively used as two ends of a single port of the original open circuit calibration piece model.

The first open circuit calibration piece model used in the Terahertz frequency band is that a series circuit composed of a resistor $R_s'$ that represents crosstalk of the open circuit calibration piece and a capacitor $C_s'$ that represents crosstalk of the open circuit calibration piece is connected, in parallel, to two ends of the single port of the original open circuit calibration piece model. Optionally, the first open circuit calibration piece model includes the open circuit calibration piece capacitor $C_{open}$, the resistor $R_s'$ that represents crosstalk of the open circuit calibration piece, and the capacitor $C_s'$ that represents crosstalk of the open circuit calibration piece. One end of the open circuit calibration piece capacitor $C_{open}$ is connected to one end of the resistor $R_s'$ that represents crosstalk of the open circuit calibration piece, thus forming one end of a single port of the first open circuit calibration piece model. The other end of the resistor $R_s'$ that represents crosstalk of the open circuit calibration piece is connected to one end of the capacitor $C_s'$ that represents crosstalk of the open circuit calibration piece, and the other end of the capacitor $C_s'$ that represents crosstalk of the open circuit calibration piece is connected to the other end of the open circuit calibration piece capacitor $C_{open}$, thus forming the other end of the single port of the first open circuit calibration piece model.

Figure 11:
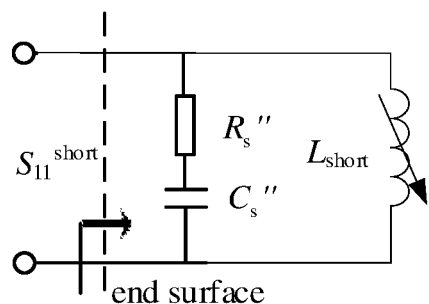
FIG. 11 is a schematic diagram of a first short circuit calibration piece model according to embodiments of the present application and used in a Terahertz frequency band.

Optionally, FIG. 1 illustrates an original short circuit calibration piece model in the prior art, and FIG. 11 illustrates a first short circuit calibration piece model used in a Terahertz frequency band provided by the present application. The original short circuit calibration piece model includes a short circuit calibration piece inductor $L_{short}$, and two ends of the short circuit calibration piece inductor $L_{short}$ are respectively used as two ends of a single port of the original short circuit calibration piece model.

The first short circuit calibration piece model used in the Terahertz frequency band is that a series circuit composed of a resistor $R_s''$ that represents crosstalk of the short circuit calibration piece and a capacitor $C_s''$ that represents crosstalk of the short circuit calibration piece is connected, in parallel, to two ends of the single port of the original short circuit calibration piece model. Optionally, the first short circuit calibration piece model includes the short circuit calibration piece inductor $L_{short}$, the resistor $R_s''$ that represents crosstalk of the short circuit calibration piece, and the capacitor $C_s''$ that represents crosstalk of the short circuit calibration piece. One end of the short circuit calibration piece inductor $L_{short}$ is connected to one end of the resistor $R_s''$ that represents crosstalk of the short circuit calibration piece, thus forming one end of a single port of the first short circuit calibration piece model. The other end of the resistor $R_s''$ that represents crosstalk of the open circuit calibration piece is connected to one end of the capacitor $C_s''$ that represents crosstalk of the open circuit calibration piece, and the other end of the capacitor $C_s''$ that represents crosstalk of the short circuit calibration piece is connected to the other end of the short circuit calibration piece inductor $L_{short}$, thus forming the other end of the single port of the first short circuit calibration piece model.

At step 102, in the Terahertz frequency band, a multi-thread TRL calibration method is used to calibrate an on-wafer S parameter measurement system, the calibrated on-wafer S parameter measurement system is used to measure the on-wafer calibration piece, and an S parameter of the on-wafer calibration piece is obtained.

Optionally, according to equivalent circuits (i.e., calibration piece models) of three different calibration pieces shown in FIG. 3, FIG. 7, and FIG. 11, in the Terahertz frequency band, the multi-thread TRL calibration method with the highest calibration accuracy is used to calibrate the measurement system, and the calibrated S parameter measurement system is used to measure the on-wafer calibration pieces, thus obtaining the S parameters of the corresponding calibration pieces.

At step 103, an admittance of the on-wafer calibration piece is calculated according to the obtained S parameter of the on-wafer calibration piece.

Optionally, the admittance of the on-wafer calibration piece is calculated according to following formula:

$$\begin{cases} S_{11} = \dfrac{Z_{open} - Z_0}{Z_{open} + Z_0} \\ Y = \dfrac{1}{Z_{open}} \end{cases},$$

where $S_{11}$ denotes the S parameter of the single port of the on-wafer calibration piece; Y denotes the admittance of the on-wafer calibration piece; $Z_{open}$ denotes an impedance of an open circuit calibration piece; and $Z_o$ denotes a system feature impedance, which is generally 50Ω.

At step 104, an admittance formula corresponding to the on-wafer calibration piece model is determined according to the on-wafer calibration piece model corresponding to the on-wafer calibration piece.

Optionally, in this step, the admittance formula corresponding to the on-wafer calibration piece model may be determined according to equivalent circuits corresponding to different on-wafer calibration pieces.

Optionally, as shown in FIG. 3, when the on-wafer calibration piece is a load calibration piece, and the on-wafer calibration model is the first load calibration piece model, the admittance formula corresponding to the first load calibration piece model is:

$$\begin{cases} Y_{load} = Y_1 + Y_2 \\ Y_1 = \dfrac{1}{R_1 + j\omega L_{load}} \\ Y_2 = \dfrac{1}{R_s + \dfrac{1}{j\omega C_s}} \end{cases},$$

where $Y_{load}$ denotes the admittance of the load calibration piece; $R_1$ denotes the load calibration piece direct-current resistance; j denotes an imaginary number; ω denotes an angular frequency; $L_{load}$ denotes the load calibration piece inductance measured at a preset frequency, a low frequency referring to a frequency of 40 GHz or below; $R_s$ denotes the resistance that represents crosstalk of the load calibration piece; $C_s$ denotes the capacitance that represents crosstalk of the load calibration piece; $Y_1$ denotes a series admittance of $R_1$ and $L_{load}$; and $Y_2$ denotes a series admittance of $C_s$ and $R_s$.

Optionally, there may be $L_{load}$ according to FIG. 2. There may be $$L_{load} = \frac{Z_0(1 + S_{11}^{load})}{j\omega(1 - S_{11}^{load})} - \frac{R}{j\omega}$$

by calculation according to $$\begin{cases} S_{11}^{load} = \frac{Z_{load} - Z_0}{Z_{load} + Z_0} \\ Z_{load} = j\omega L_{load} + R \end{cases},$$

where ω=2πf, $S_{11}^{load}$ denotes a load reflection coefficient of the end surface in FIG. 2; $Z_{load}$ denotes an input impedance of the load calibration piece; and R denotes the direct-current resistance of the load calibration piece.

Optionally, as shown in FIG. 7, when the on-wafer calibration piece is an open circuit calibration piece, and the on-wafer calibration model is the first open circuit calibration piece model, the admittance formula corresponding to the first open circuit calibration piece model is:

$$\begin{cases} Y_{open} = Y_1' + Y_2' \\ Y_1' = j\omega C_{open} \\ Y_2' = \frac{1}{R_s' + \frac{1}{j\omega C_s'}} \end{cases},$$

where $Y_{open}$ denotes the admittance of the open circuit calibration piece; $C_{open}$ denotes the open circuit calibration piece capacitance measured at a preset frequency, the preset frequency referring to a frequency of 40 GHz or below; $R_s'$ denotes the resistance that represents crosstalk of the open circuit calibration piece; $C_s'$ denotes the capacitance that represents crosstalk of the open circuit calibration piece; $Y_1'$ denotes the admittance of $C_{open}$; and $Y_2'$ denotes a series admittance of $C_s'$ and $R_s'$.

Optionally, there may be $C_{open}$ according to FIG. 6. There may be $$C_{open} = \frac{1 - S_{11}^{open}}{j\omega Z_0(1 + S_{11}^{open})}$$

by calculation according to $$\begin{cases} S_{11}^{open} = \frac{Z_{open} - Z_0}{Z_{open} + Z_0} \\ Z_{open} = \frac{1}{j\omega C_{open}} \end{cases},$$

where $S_{11}^{open}$ denotes an open circuit reflection coefficient of the end surface in FIG. 6, and $Z_{open}$ denotes an input impedance of the open circuit calibration piece in FIG. 6.

Optionally, as shown in FIG. 11, when the on-wafer calibration piece is a short circuit calibration piece, and the on-wafer calibration model is the first short circuit calibration piece model, the admittance formula corresponding to the first short circuit calibration piece model is:

$$\begin{cases} Y_{short} = Y_1'' + Y_2'' \\ Y_1'' = \frac{1}{j\omega L_{short}} \\ Y_2'' = \frac{1}{R_s'' + \frac{1}{j\omega C_s''}} \end{cases},$$

where $Y_{short}$ denotes the admittance of the short circuit calibration piece; $L_{short}$ denotes the short circuit calibration piece inductance measured at a preset frequency, the preset frequency referring to a frequency of 40 GHz and below; $R_s''$ denotes a resistance of crosstalk of the short circuit calibration piece; $C_s''$ denotes a capacitance of crosstalk of the short circuit calibration piece; $Y_1''$ denotes the admittance of $L_{short}$; and $Y_2''$ denotes a series admittance of $C_s''$ and $R_s''$.

Figure 10:
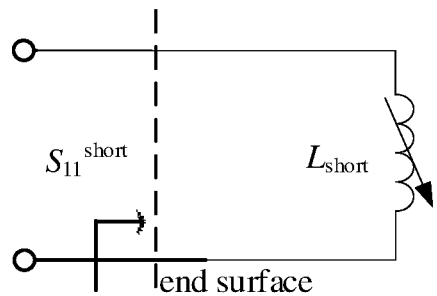
FIG. 10 is a schematic diagram of an original short circuit calibration piece model in the prior art.

Optionally, there may be $L_{short}$ according to FIG. 10. There may be $$L_{short} = \frac{Z_0(1 + S_{11}^{short})}{j\omega(1 - S_{11}^{short})}$$

by calculation according to $$\begin{cases} S_{11}^{short} = \frac{Z_{short} - Z_0}{Z_{short} + Z_0} \\ Z_{short} = j\omega L_{short} \end{cases},$$

where ω=2πf, $S_{11}^{short}$ denotes a short circuit reflection coefficient of the end surface in FIG. 10, and $Z_{short}$ denotes an input impedance of the short circuit calibration piece in FIG. 10.

At step 105, a plurality of different parameters that represent crosstalk of calibration pieces in the on-wafer calibration piece model are calculated according to the admittance of the on-wafer calibration piece and the corresponding admittance formula.

Optionally, this step may include substituting the admittance of the on-wafer calibration piece into the corresponding admittance formula for calculation to obtain an impedance corresponding to the series admittance of the capacitance that represents the crosstalk of the calibration piece and the resistance that represents the crosstalk of the calibration piece. A real part of the impedance is the resistance that represents crosstalk of different on-wafer calibration pieces, and an imaginary part of the impedance is the capacitance that represents crosstalk of different on-wafer calibration pieces. That is, the parameters that represent crosstalk of the calibration piece in the first load calibration piece model include the resistance that represents crosstalk of the load calibration piece and the capacitance that represents crosstalk of the load calibration piece.

For example, when the on-wafer calibration piece is the load calibration piece, the calculated admittance of the load calibration piece may be $$Y = \frac{1 - S_{11}}{(1 + S_{11}) \cdot Z_0}.$$

It is substituted into the admittance formula corresponding to the first load calibration piece model to obtain $$R_s + \frac{1}{j\omega C_s} = \frac{1}{\frac{1 - S_{11}}{(1 + S_{11}) \cdot Z_0} - \frac{1}{R_1 + j\omega L_{load}}}.$$

In this way, the real part of $$\frac{1}{\frac{1 - S_{11}}{(1 + S_{11}) \cdot Z_0} - \frac{1}{R_1 + j\omega L_{load}}} \text{ is } R_s;$$

$$Z = \frac{1}{\frac{1 - S_{11}}{(1 + S_{11}) \cdot Z_0} - \frac{1}{R_1 + j\omega L_{load}}}$$

is used, i.e., $R_s$=real (Z), $$C_s = -\frac{1}{imag(Z) \cdot \omega},$$

where Z denotes the impedance corresponding to the series admittance of the capacitance that represents the crosstalk of the load calibration piece and the resistance that represents the crosstalk of the load calibration piece.

Similarly, an impedance corresponding to the series admittance of the capacitance that represents the crosstalk of the open circuit calibration piece and the resistance that represents the crosstalk of the open circuit calibration piece, and an impedance corresponding to the series admittance of the capacitance that represents the crosstalk of the short circuit calibration piece and the resistance that represents the crosstalk of the short circuit calibration piece may be obtained. The capacitance that represents the crosstalk of the open circuit calibration piece and the resistance that represents the crosstalk of the open circuit calibration piece, and the capacitance that represents the crosstalk of the short circuit calibration piece and the resistance that represents the crosstalk of the short circuit calibration piece may be further obtained.

It should be noted that in the above embodiment, the capacitance and the resistance that are obtained by calculating any one of the first load calibration piece model, the first open circuit calibration piece model, and the first short circuit calibration piece model and represent the crosstalk of the calibration piece may also be applied to other models. For example, the capacitance and the resistance that are obtained by calculating the first load calibration piece model and represent the crosstalk of the calibration piece may also be applied to the first open circuit calibration piece model and the first short circuit calibration piece model; the capacitance and the resistance that are obtained by calculating the first open calibration piece model and represent the crosstalk of the calibration piece may also be applied to the first load calibration piece model and the first short circuit calibration piece model; and the capacitance and the resistance that are obtained by calculating the first short circuit calibration piece model and represent the crosstalk of the calibration piece may also be applied to the first load calibration piece model and the first open circuit calibration piece model. During calibration of a calibration piece, one calibration model may be used to obtain a corresponding capacitance and resistance that represent the crosstalk of the calibration piece, and the capacitance and the resistance may be applied to other calibration piece models, without calculating capacitances and resistances that correspond to other calibration models and represent crosstalk of the calibration piece, so that the calibration time can be saved, and the generality of the on-wafer calibration piece model can be improved.

In the above method for determining the parameters in the on-wafer calibration piece model, the on-wafer calibration piece model used in the Terahertz frequency band is provided. The on-wafer calibration piece model is that a circuit formed by connecting, in series, two elements that represent crosstalk of the on-wafer calibration piece is connected, in parallel, to two ends of the end surface of the original calibration piece model. In the Terahertz frequency band, the multi-thread TRL calibration method is used to calibrate the on-wafer S parameter measurement system, and the calibrated on-wafer S parameter measurement system is used for measurement, thus obtaining the S parameter of the on-wafer calibration piece; the admittance of the on-wafer calibration piece is calculated according to the S parameter of the on-wafer calibration piece; the admittance formula corresponding to the on-wafer calibration piece model is determined according to the on-wafer calibration piece model corresponding to the on-wafer calibration piece; and the plurality of different parameters that represent crosstalk of the calibration piece in the on-wafer calibration piece model are calculated according to the admittance of the on-wafer calibration piece and the corresponding admittance formula. The on-wafer calibration piece model provided by the present embodiment solves calibration and measurement errors caused by imperfection of the original on-wafer calibration piece model in the terahertz frequency band and improves the test accuracy of the on-wafer S parameters in the terahertz frequency band. In addition, the present embodiment further provides a method for calculating parameters in different on-wafer calibration piece models.

Another embodiment of the method for determining parameters in an on-wafer calibration piece model is described below with continuous reference to FIG. 1. Specific following steps are as follows.

At step 101, an on-wafer calibration piece model set is constructed, the on-wafer calibration piece model set including a plurality of different on-wafer calibration piece models used in a Terahertz frequency band, each of the on-wafer calibration piece models has a corresponding on-wafer calibration piece; one on-wafer calibration model is selected from the on-wafer calibration piece model set.

The plurality of different on-wafer calibration piece models used in the Terahertz frequency band are that a circuit formed by connecting, in series, two elements that represent different crosstalk of the on-wafer calibration piece is connected, in parallel, to two ends of an end surface of an original calibration piece model.

Figure 4:
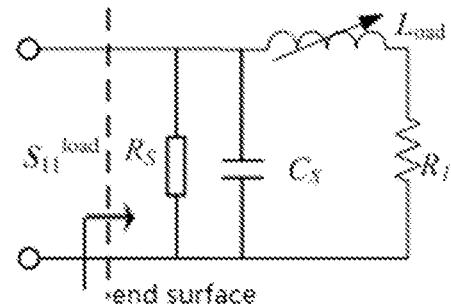
FIG. 4 is a schematic diagram of a second load calibration piece model according to the embodiments of the present application and used in a Terahertz frequency band.

Optionally, FIG. 2 illustrates an original load calibration piece model in the prior art, and FIG. 4 illustrates a second load calibration piece model used in a Terahertz frequency band provided by the present application. The original load calibration piece model includes a load calibration piece inductor $L_{load}$ and a load calibration piece direct-current resistor $R_1$. One end of the load calibration piece inductor $L_{load}$ is one end of a single port of the original load calibration piece model, and the other end of the load calibration piece inductor $L_{load}$ is connected to one end of the load calibration piece direct-current resistor $R_1$. The other end of the load calibration piece direct-current resistor $R_1$ is the other end of the single port of the original load calibration piece model.

The second load calibration piece model used in the Terahertz frequency band is that a circuit composed of a resistor $R_s$ that represents crosstalk of the load calibration piece and a capacitor $C_s$ that represents crosstalk of the load calibration piece is connected, in parallel, to two ends of the single port of the original load calibration piece model. Optionally, the second load calibration piece model includes the load calibration piece inductor $L_{load}$, the load calibration piece direct-current resistor $R_1$, the resistor $R_s$ that represents crosstalk of the load calibration piece, and the capacitor $C_s$ that represents crosstalk of the load calibration piece. One end of the load calibration piece inductor $L_{load}$ is connected to one end of the resistor $R_s$ that represents crosstalk of the load calibration piece and one end of the capacitor $C_s$ that represents crosstalk of the load calibration piece, thus forming one end of a single port of the second load calibration piece model. The other end of the load calibration piece inductor $L_{load}$ is connected to one end of the load calibration piece direct-current resistor $R_1$, the other end of the load calibration piece direct-current resistor $R_1$ is connected to other end of the capacitor $C_s$ that represents crosstalk of the load calibration piece and the other end of the resistor $R_s$ that represents crosstalk of the load calibration piece, thus forming the other end of the single port of the second load calibration piece model.

Figure 8:
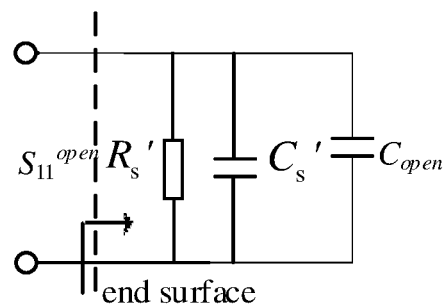
FIG. 8 is a schematic diagram of a second open circuit calibration piece model according to embodiments of the present application and used in a Terahertz frequency band.

Optionally, FIG. 6 illustrates an original open circuit calibration piece model in the prior art, and FIG. 8 illustrates a second open circuit calibration piece model used in a Terahertz frequency band provided by the present application. The original open circuit calibration piece model includes an open circuit calibration piece capacitor $C_{open}$, and two ends of the open circuit calibration piece capacitor $C_{open}$ are respectively used as two ends of a single port of the original open circuit calibration piece model.

The second open circuit calibration piece model used in the Terahertz frequency band is that a circuit composed of a resistor $R_s'$ that represents crosstalk of the open circuit calibration piece and a capacitor $C_s'$ that represents crosstalk of the open circuit calibration piece is connected, in parallel, to two ends of the single port of the original open circuit calibration piece model. Optionally, the second load calibration piece model includes the open circuit calibration piece capacitor $C_{open}$, the resistor $R_s'$ that represents crosstalk of the open circuit calibration piece, and the capacitor $C_s'$ that represents crosstalk of the open circuit calibration piece. One end of the open circuit calibration piece capacitor $C_{open}$ is connected to one end of the resistor $R_s'$ that represents crosstalk of the open circuit calibration piece and one end of the capacitor $C_s'$ that represents crosstalk of the open circuit calibration piece, thus forming one end of a single port of the second open circuit calibration piece model. The other end of the open circuit calibration piece capacitor $C_{open}$ is connected to the other end of the capacitor $C_s'$ that represents crosstalk of the open circuit calibration piece and the other end of the resistor $R_s'$ that represents crosstalk of the open circuit calibration piece, thus forming the other end of the single port of the second open circuit calibration piece model.

Figure 12:
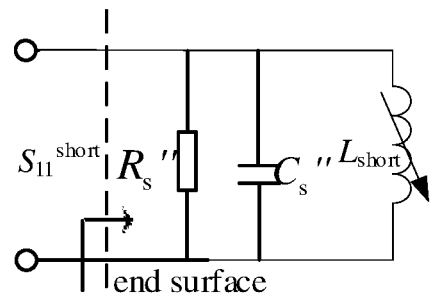
FIG. 12 is a schematic diagram of a second short circuit calibration piece model according to embodiments of the present application and used in a Terahertz frequency band.

Optionally, FIG. 10 illustrates an original short circuit calibration piece model in the prior art, and FIG. 12 illustrates a second short circuit calibration piece model used in a Terahertz frequency band provided by the present application. The original short circuit calibration piece model includes a short circuit calibration piece inductor $L_{short}$, and two ends of the short circuit calibration piece inductor $L_{short}$ are respectively used as two ends of a single port of the original short circuit calibration piece model.

The second short circuit calibration piece model used in the Terahertz frequency band is that a circuit composed of a resistor $R_s''$ that represents crosstalk of the short circuit calibration piece and a capacitor $C_s''$ that represents crosstalk of the short circuit calibration piece is connected, in parallel, to two ends of the single port of the original short circuit calibration piece model. Optionally, the second short circuit calibration piece model includes the short circuit calibration piece inductor $L_{short}$, the resistor $R_s''$ that represents crosstalk of the short circuit calibration piece, and the capacitor $C_s''$ that represents crosstalk of the short circuit calibration piece. One end of the short circuit calibration piece inductor $L_{short}$ is connected to one end of the resistor $R_s''$ that represents crosstalk of the short circuit calibration piece and one end of the capacitor $C_s''$ that represents crosstalk of the short circuit calibration piece, thus forming one end of a single port of the second short circuit calibration piece model. The other end of the short circuit calibration piece inductor $L_{short}$ is connected to the other end of the capacitor $C_s''$ that represents crosstalk of the short circuit calibration piece and the other end of the resistor $R_s''$ that represents crosstalk of the short circuit calibration piece, thus forming the other end of the single port of the second short circuit calibration piece model.

At step 102, in the Terahertz frequency band, a multi-thread TRL calibration method is used to calibrate an on-wafer S parameter measurement system, the calibrated on-wafer S parameter measurement system is used to measure the on-wafer calibration piece, and an S parameter of the on-wafer calibration piece is obtained.

Optionally, according to equivalent circuits (i.e., calibration piece models) of three different calibration pieces shown in FIG. 4, FIG. 8, and FIG. 12, in the Terahertz frequency band, the multi-thread TRL calibration method with the highest calibration accuracy is used to calibrate the measurement system, and the calibrated S parameter measurement system is used to measure the on-wafer calibration pieces, thus obtaining the S parameters of the corresponding calibration pieces.

At step 103, an admittance of the on-wafer calibration piece is calculated according to the obtained S parameter of the on-wafer calibration piece.

Optionally, the admittance of the on-wafer calibration piece is calculated according to following formula:

$$\begin{cases} S_{11} = \dfrac{Z_{open} - Z_0}{Z_{open} + Z_0} \\ Y = \dfrac{1}{Z_{open}} \end{cases},$$

where $S_{11}$ denotes the S parameter of the single port of the on-wafer calibration piece; Y denotes the admittance of the on-wafer calibration piece; $Z_{open}$ denotes an impedance of an open circuit calibration piece; and $Z_o$ denotes a system feature impedance, which is generally 50Ω.

At step 104, an admittance formula corresponding to the on-wafer calibration piece model is determined according to the on-wafer calibration piece model corresponding to the on-wafer calibration piece.

Optionally, in this step, the admittance formula corresponding to the on-wafer calibration piece model may be determined according to equivalent circuits corresponding to different on-wafer calibration pieces.

Optionally, as shown in FIG. 4, when the on-wafer calibration piece is a load calibration piece, and the on-wafer calibration model is the second load calibration piece model, the admittance formula corresponding to the second load calibration piece model is:

$$\begin{cases} Y_{load}' = Y_1 + Y_2 + Y_3 \\ Y_1 = \dfrac{1}{R_1 + j\omega L_{load}} \\ Y_2 = j\omega C_s \\ Y_3 = \dfrac{1}{R_s} \end{cases},$$

where $Y_{load}'$ denotes the admittance of the load calibration piece; $R_1$ denotes the load calibration piece direct-current resistance; j denotes an imaginary number; ω denotes an angular frequency; $L_{load}$ denotes the load calibration piece inductance measured at a preset frequency, a low frequency referring to a frequency of 40 GHz or below; $R_s$ denotes the resistance that represents crosstalk of the load calibration piece; $C_s$ denotes the capacitance that represents crosstalk of the load calibration piece; $Y_1$ denotes a series admittance of $R_1$ and $L_{load}$; and $Y_2$ denotes a series admittance of $C_s$ and $R_s$.

Optionally, there may be $L_{load}$ according to FIG. 2. There may be $$L_{load} = \dfrac{Z_0(1+S_{11}^{load})}{j\omega(1-S_{11}^{load})} - \dfrac{R}{j\omega}$$

by calculation according to $$\begin{cases} S_{11}^{load} = \dfrac{Z_{load} - Z_0}{Z_{load} + Z_0} \\ Z_{load} = j\omega L_{load} + R \end{cases},$$

where $\omega = 2\pi f$, $S_{11}^{load}$ denotes a load reflection coefficient of the end surface in FIG. 2; $Z_{load}$ denotes an input impedance of the load calibration piece; and R denotes the direct-current resistance of the load calibration piece.

Optionally, as shown in FIG. 8, when the on-wafer calibration piece is an open circuit calibration piece, and the on-wafer calibration model is the second open circuit calibration piece model, the admittance formula corresponding to the second open circuit calibration piece model is:

$$\begin{cases} Y_{open}' = Y_1' + Y_2' + Y_3' \\ Y_1' = j\omega C_{open} \\ Y_2' = j\omega C_s' \\ Y_3' = \dfrac{1}{R_s'} \end{cases},$$

where $Y_{open}'$ denotes the admittance of the open circuit calibration piece; $C_{open}$ denotes the open circuit calibration piece capacitance measured at a preset frequency, the preset frequency referring to a frequency of 40 GHz or below; $R_s'$ denotes the resistance that represents crosstalk of the open circuit calibration piece; $C_s'$ denotes the capacitance that represents crosstalk of the open circuit calibration piece; $Y_1'$ denotes the admittance of $C_{open}$; and $Y_2'$ denotes a series admittance of $C_s'$ and $R_s'$.

Optionally, there may be $C_{open}$ according to FIG. 6. There may be $$C_{open} = \dfrac{1 - S_{11}^{open}}{j\omega Z_0(1+S_{11}^{open})}$$

by calculation according t $$\begin{cases} S_{11}^{open} = \dfrac{Z_{open} - Z_0}{Z_{open} + Z_0} \\ Z_{open} = \dfrac{1}{j\omega C_{open}} \end{cases},$$

where $S_{11}^{open}$ denotes an open circuit reflection coefficient of the end surface in FIG. 6, and $Z_{open}$ denotes an input impedance of the open circuit calibration piece in FIG. 6.

Optionally, as shown in FIG. 12, when the on-wafer calibration piece is a short circuit calibration piece, and the on-wafer calibration model is the second short circuit calibration piece model, the admittance formula corresponding to the second short circuit calibration piece model is:

$$\begin{cases} Y_{short}' = Y_1'' + Y_2'' + Y_3'' \\ Y_1'' = \dfrac{1}{j\omega L_{short}} \\ Y_2'' = j\omega C_s'' \\ Y_3'' = \dfrac{1}{R_s''} \end{cases},$$

where $Y_{short}'$ denotes the admittance of the short circuit calibration piece; $L_{short}$ denotes the short circuit calibration piece inductance measured at a preset frequency, the preset frequency referring to a frequency of 40 GHz and below; $R_s''$ denotes the resistance that represents crosstalk of the short circuit calibration piece; $C_s''$ denotes the capacitance that represents crosstalk of the short circuit calibration piece; $Y_1''$ denotes the admittance of $L_{short}$; and $Y_2''$ denotes a series admittance of $C_s''$ and $R_s''$.

Optionally, there may be $L_{load}$ according to FIG. 10. There may be $$L_{short} = \frac{Z_0(1 + S_{11}^{short})}{j\omega(1 - S_{11}^{short})}$$

by calculation according to $$\begin{cases} S_{11}^{short} = \frac{Z_{short} - Z_0}{Z_{short} + Z_0} \\ Z_{short} = j\omega L_{short} \end{cases},$$

where $\omega=2\pi f$, $S_{11}^{short}$ denotes a short circuit reflection coefficient of the end surface in FIG. 10, and $Z_{short}$ denotes an input impedance of the short circuit calibration piece in FIG. 10.

At step 105, a plurality of different parameters that represent crosstalk of the calibration piece in the on-wafer calibration piece model are calculated according to the admittance of the on-wafer calibration piece and the corresponding admittance formula.

Optionally, this step may include substituting the admittance of the on-wafer calibration piece into the corresponding admittance formula for calculation to obtain an impedance corresponding to the series admittance of the capacitance that represents the crosstalk of the calibration piece and the resistance that represents the crosstalk of the calibration piece. A real part of the impedance is the resistance that represents crosstalk of different on-wafer calibration pieces, and an imaginary part of the impedance is the capacitance that represents crosstalk of different on-wafer calibration pieces. That is, the parameters that represent the crosstalk of the calibration pieces in the second load calibration piece model includes the resistance that represents the crosstalk of the load calibration piece and the capacitance that represents the crosstalk of the load calibration piece.

For example, when the on-wafer calibration piece is the load calibration piece, the calculated admittance of the load calibration piece may be $$Y = \frac{1 - S_{11}}{(1 + S_{11}) \cdot Z_0}.$$

It is substituted into the admittance formula corresponding to the second load calibration piece model to obtain $$j\omega C_s + \frac{1}{R_s} = \frac{1 - S_{11}}{(1 + S_{11}) \cdot Z_0} - \frac{1}{R_1 + j\omega L_{load}}.$$

In this way, $$Y_p = \frac{1 - S_{11}}{(1 + S_{11}) \cdot Z_0} - \frac{1}{R_1 + j\omega L_{load}}$$

is used, i.e., $$R_s = \frac{1}{\text{real}(Y_p)}, C_s = \frac{\text{imag}(Y_p)}{\omega},$$

where P denotes a parallel admittance of the capacitance that represents the crosstalk of the load calibration piece and the resistance that represents the crosstalk of the load calibration piece.

Similarly, an impedance corresponding to the series admittance of the capacitance that represents the crosstalk of the open circuit calibration piece and the resistance that represents the crosstalk of the open circuit calibration piece, and an impedance corresponding to the series admittance of the capacitance that represents the crosstalk of the short circuit calibration piece and the resistance that represents the crosstalk of the short circuit calibration piece may be obtained. The capacitance that represents the crosstalk of the open circuit calibration piece and the resistance that represents the crosstalk of the open circuit calibration piece, and the capacitance that represents the crosstalk of the short circuit calibration piece and the resistance that represents the crosstalk of the short circuit calibration piece may be further obtained.

It should be noted that in the above embodiment, the capacitance and the resistance that are obtained by calculating any one of the second load calibration piece model, the second open circuit calibration piece model, and the second short circuit calibration piece model and represent the crosstalk of the calibration piece may also be applied to other models. For example, the capacitance and the resistance that are obtained by calculating the second load calibration piece model and represent the crosstalk of the calibration piece may also be applied to the second open circuit calibration piece model and the second short circuit calibration piece model; the capacitance and the resistance that are obtained by calculating the second open calibration piece model and represent the crosstalk of the calibration piece may also be applied to the second load calibration piece model and the second short circuit calibration piece model; and the capacitance and the resistance that are obtained by calculating the second short circuit calibration piece model and represent the crosstalk of the calibration piece may also be applied to the second load calibration piece model and the second open circuit calibration piece model. During calibration of a calibration piece, one calibration model may be used to obtain a corresponding capacitance and resistance that represent the crosstalk of the calibration piece, and the capacitance and the resistance may be applied to other calibration piece models, without calculating capacitances and resistances that correspond to other calibration models and represent crosstalk of the calibration piece, so that the calibration time can be saved, and the generality of the on-wafer calibration piece model can be improved.

In the above method for determining the parameters in the on-wafer calibration piece model, the on-wafer calibration piece model used in the Terahertz frequency band is provided. The on-wafer calibration piece model is that a circuit composed of two elements that represent crosstalk of the on-wafer calibration piece is connected, in parallel, to two ends of the end surface of the original calibration piece model. In the Terahertz frequency band, the multi-thread TRL calibration method is used to calibrate the on-wafer S parameter measurement system, and the calibrated on-wafer S parameter measurement system is used for measurement, thus obtaining the S parameter of the on-wafer calibration piece; the admittance of the on-wafer calibration piece is calculated according to the S parameter of the on-wafer calibration piece; the admittance formula corresponding to the on-wafer calibration piece model is determined according to the on-wafer calibration piece model corresponding to the on-wafer calibration piece; and the plurality of different parameters that represent crosstalk of the calibration piece in the on-wafer calibration piece model are calculated according to the admittance of the on-wafer calibration piece and the corresponding admittance formula. The on-wafer calibration piece model provided by the present embodiment solves calibration and measurement errors caused by imperfection of the original on-wafer calibration piece model in the terahertz frequency band and improves the test accuracy of the on-wafer S parameters in the terahertz frequency band. In addition, the present embodiment further provides a method for calculating parameters in different on-wafer calibration piece models.

Another embodiment of the method for determining parameters in an on-wafer calibration piece model is described below with continuous reference to FIG. 1, as shown below.

At step 101, an on-wafer calibration piece model set is constructed, the on-wafer calibration piece model set including a plurality of different on-wafer calibration piece models used in a Terahertz frequency band, each of the on-wafer calibration piece models has a corresponding on-wafer calibration piece; one on-wafer calibration model is selected from the on-wafer calibration piece model set.

Figure 14:
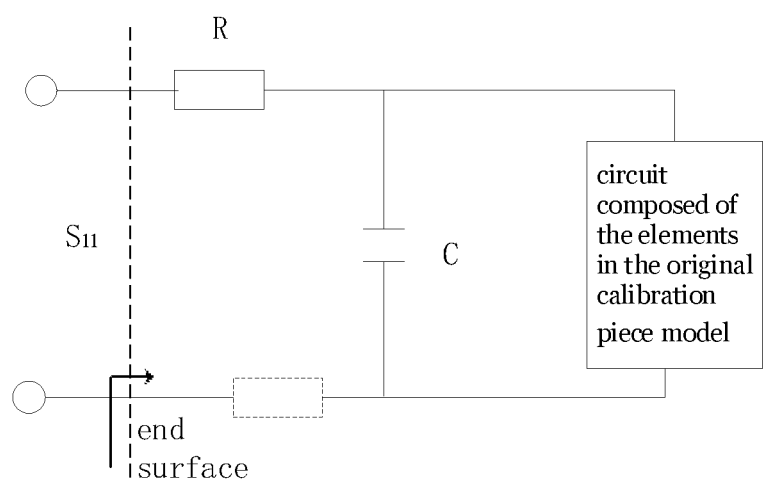
FIG. 14 is a schematic diagram of an on-wafer calibration piece model according to embodiments of the present application.

As shown in FIG. 14, the plurality of different on-wafer calibration piece models used in the Terahertz frequency band have the following features. A resistor that represents crosstalk of the on-wafer calibration piece is connected in series with a circuit composed of elements in an original calibration piece model; one end of a capacitor that represents crosstalk of the on-wafer calibration piece is connected between the resistor that represents crosstalk of the on-wafer calibration piece and the circuit composed of the elements in the original calibration piece model; and the other end of the capacitor that represents crosstalk of the on-wafer calibration piece is connected to the other end of the circuit composed of the elements in the original calibration piece model.

The dotted lines in FIG. 14 indicate that the position of the resistor R that represents crosstalk of the on-wafer calibration piece is selectable, which may be the position shown by R, or may be the position shown by the resistor in dotted lines.

Since a new error item appears in coupling between probes in the Terahertz frequency band, the traditional original open circuit calibration piece, original short circuit calibration piece, and original load calibration piece cannot effectively represent a crosstalk error, and the test accuracy of the on-wafer S parameters in the Terahertz frequency band is low. Therefore, in the present application, on the basis of the traditional original on-wafer calibration piece models, crosstalk elements are added at the single ports of the original open circuit calibration piece, the original short circuit calibration piece, and the original load calibration piece to construct new measurement models, thus improving the test accuracy of the on-wafer S parameters in the Terahertz frequency band.

Figure 5:
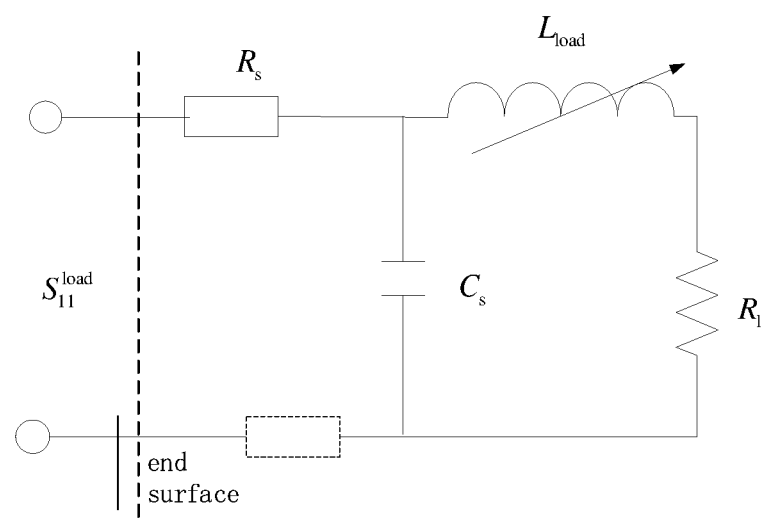
FIG. 5 is a schematic diagram of a third load calibration piece model according to embodiments of the present application and used in a Terahertz frequency band.

Optionally, FIG. 2 illustrates an original load calibration piece model in the prior art, and FIG. 5 illustrates a third load calibration piece model used in a Terahertz frequency band provided by the present application. The original load calibration piece model includes a load calibration piece inductor $L_{load}$ and a load calibration piece direct-current resistor $R_1$. One end of the load calibration piece inductor $L_{load}$ is one end of a single port of the original load calibration piece model, and the other end of the load calibration piece inductor $L_{load}$ is connected to one end of the load calibration piece direct-current resistor $R_1$. The other end of the load calibration piece direct-current resistor $R_1$ is the other end of the single port of the original load calibration piece model.

Optionally, as shown in FIG. 5, when the on-wafer calibration piece model is the third load calibration piece model, the third load calibration piece model further includes the resistor $R_s$ that represents crosstalk of the load calibration piece and the capacitor $C_s$ that represents crosstalk of the load calibration piece. One end of the resistor $R_s$ that represents crosstalk of the load calibration piece is connected to one end of the capacitor $C_s$ that represents crosstalk of the load calibration piece and one end of the load calibration piece inductor $L_{load}$. The other end of the resistor $R_s$ that represents crosstalk of the load calibration piece is used as one end of a single port of the third load calibration piece model, the other end of the load calibration piece inductor $L_{load}$ is connected to one end of the load calibration piece direct-current resistor $R_1$, and the other end of the load calibration piece direct-current resistor $R_1$ is connected to the other end of the capacitor $C_s$ that represents crosstalk of the load calibration piece, thus forming the other end of the single port of the third load calibration piece model.

Or, when the resistor $R_s$ that represents crosstalk of the load calibration piece is located at the position shown by the resistor in dotted lines, one end of the capacitor $C_s$ that represents crosstalk of the load calibration piece is connected to one end of the load calibration piece inductor $L_{load}$ and one end of the single port of the third load calibration piece model; and the other end of the load calibration piece inductor $L_{load}$ is connected to one end of the load calibration piece direct-current resistor $R_1$, and the other end of the load calibration piece direct-current resistor $R_1$ is connected to the other end of the capacitor $C_s$ that represents crosstalk of the load calibration piece and one end of the resistor $R_s$ that represents crosstalk of the load calibration piece; and the other end of the resistor $R_s$ that represents crosstalk of the load calibration piece is used as the other end of the single port of the third load calibration piece model.

Figure 9:
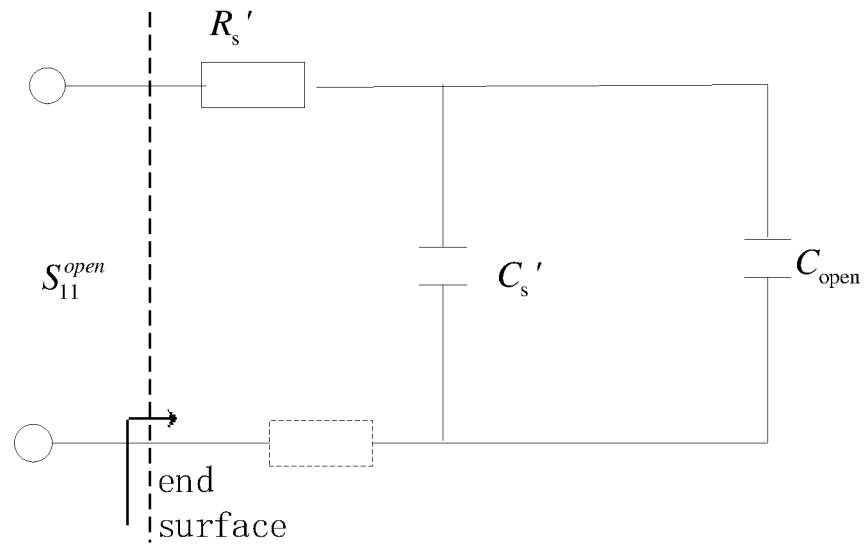
FIG. 9 is a schematic diagram of a third open circuit calibration piece model according to embodiments of the present application and used in a Terahertz frequency band.

Optionally, FIG. 6 illustrates an original open circuit calibration piece model in the prior art, and FIG. 9 illustrates a third open circuit calibration piece model used in a Terahertz frequency band provided by the present application. The original open circuit calibration piece model includes an open circuit calibration piece capacitor $C_{open}$, and two ends of the open circuit calibration piece capacitor $C_{open}$ are respectively used as two ends of a single port of the original open circuit calibration piece model.

Optionally, as shown in FIG. 9, when the on-wafer calibration piece model is the third open circuit calibration piece model, the third open circuit calibration piece model further includes the resistor $R_s'$ that represents crosstalk of the open circuit calibration piece and the capacitor $C_s'$ that represents crosstalk of the open circuit calibration piece. One end of the resistor $R_s'$ that represents crosstalk of the open circuit calibration piece is used as one end of a single port of the third open circuit calibration piece model. The other end of the resistor $R_s'$ that represents crosstalk of the open circuit calibration piece is connected to one end of the open circuit calibration piece capacitor and one end of the capacitor $C_s'$ that represents crosstalk of the open circuit calibration piece, and the other end of the open circuit calibration piece capacitor $C_{open}$ is connected to the other end of the capacitor $C_s'$ that represents crosstalk of the open circuit calibration piece, thus forming the other end of the single port of the third open circuit calibration piece model.

Or, when the resistor $R_s$ that represents crosstalk of the load calibration piece is located at the position shown by the resistor in dotted lines, one end of the open circuit calibration piece capacitor $C_{open}$ and one end of the capacitor $C_s'$ that represents crosstalk of the open circuit calibration piece are connected and are then used as one end of the single port of the third open circuit calibration piece model; the other end of the open circuit calibration piece capacitor $C_{open}$ and the other end of the capacitor $C_s'$ that represents crosstalk of the open circuit calibration piece are connected and are then connected to one end of the resistor $R_s'$ that represents crosstalk of the open circuit calibration piece; and the other end of the resistor $R_s'$ that represents crosstalk of the open circuit calibration piece is used as the other end of the single port of the third open circuit calibration piece model.

Figure 13:
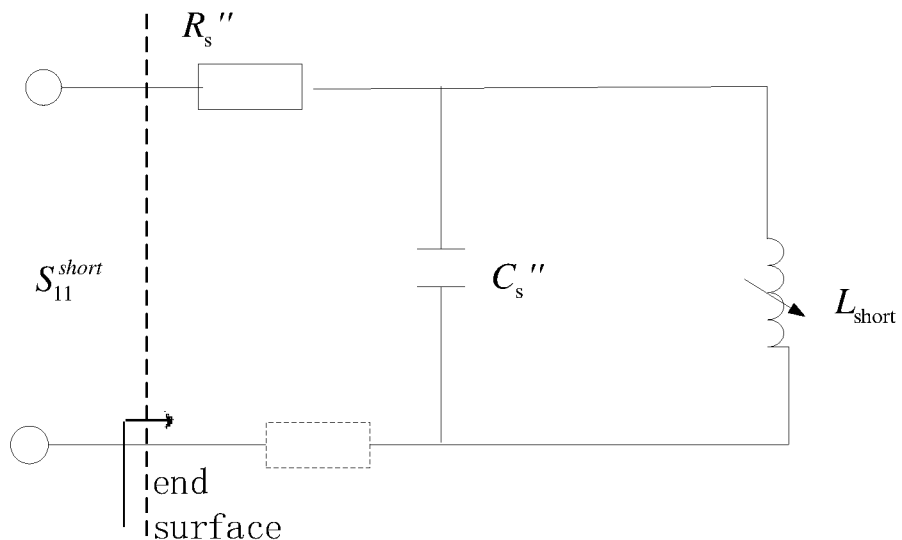
FIG. 13 is a schematic diagram of a third short circuit calibration piece model according to embodiments of the present application and used in a Terahertz frequency band.

Optionally, FIG. 10 illustrates an original short circuit calibration piece model in the prior art, and FIG. 13 illustrates a third short circuit calibration piece model used in a Terahertz frequency band provided by the present application. The original short circuit calibration piece model includes a short circuit calibration piece inductor $L_{short}$, and two ends of the short circuit calibration piece inductor $L_{short}$ are respectively used as two ends of a single port of the original short circuit calibration piece model.

Optionally, as shown in FIG. 13, when the on-wafer calibration piece model is the third short circuit calibration piece model, the third short circuit calibration piece model further includes the resistor $R_s''$ that represents crosstalk of the short circuit calibration piece and the capacitor $C_s''$ that represents crosstalk of the short circuit calibration piece. One end of the resistor $R_s''$ that represents crosstalk of the short circuit calibration piece is used as one end of a single port of the third open circuit calibration piece model. The other end of the resistor $R_s''$ that represents crosstalk of the short circuit calibration piece is connected to one end of the short circuit calibration piece inductor $L_{short}$ and one end of the capacitor $C_s''$ that represents crosstalk of the short circuit calibration piece, and the other end of the short circuit calibration piece inductor $L_{short}$ is connected to the other end of the capacitor $C_s''$ that represents crosstalk of the short circuit calibration piece, thus forming the other end of the single port of the third open circuit calibration piece model.

Or, when the resistor $R_s$ that represents crosstalk of the load calibration piece is located at the position shown by the resistor in dotted lines, one end of the short circuit calibration piece inductor $L_{short}$ and one end of the capacitor $C_s''$ that represents crosstalk of the short circuit calibration piece are connected and are then used as one end of the single port of the third open circuit calibration piece model; the other end of the short circuit calibration piece inductor $L_{short}$ and the other end of the capacitor $C_s''$ that represents crosstalk of the short circuit calibration piece are connected and are then connected to one end of the resistor $R_s''$ that represents crosstalk of the short circuit calibration piece; and the other end of the resistor $R_s''$ that represents crosstalk of the short circuit calibration piece is used as the other end of the single port of the third open circuit calibration piece model.

At step 102, in the Terahertz frequency band, a multi-thread TRL calibration method is used to calibrate an on-wafer S parameter measurement system, the calibrated on-wafer S parameter measurement system is used to measure the on-wafer calibration piece, and an S parameter of the on-wafer calibration piece is obtained.

Optionally, according to equivalent circuits (i.e., calibration piece models) of three different calibration pieces shown in FIG. 5, FIG. 9, and FIG. 13, in the Terahertz frequency band, the multi-thread TRL calibration method with the highest calibration accuracy is used to calibrate the measurement system, and the calibrated S parameter measurement system is used to measure the on-wafer calibration pieces, thus obtaining the S parameters of the corresponding calibration pieces.

At step 103, an admittance of the on-wafer calibration piece is calculated according to the obtained S parameter of the on-wafer calibration piece.

Optionally, the admittance of the on-wafer calibration piece is calculated according to following formula:

$$\begin{cases} S_{11} = \dfrac{Z_{open} - Z_0}{Z_{open} + Z_0} \\ Y = \dfrac{1}{Z_{open}} \end{cases},$$

where $S_{11}$ denotes the S parameter of the single port of the on-wafer calibration piece; Y denotes the admittance of the on-wafer calibration piece; $Z_{open}$ denotes an impedance of an open circuit calibration piece; and $Z_o$ denotes a system feature impedance, which is generally $50\Omega$.

At step 104, an admittance formula corresponding to the on-wafer calibration piece model is determined according to the on-wafer calibration piece model corresponding to the on-wafer calibration piece.

Optionally, in this step, the admittance formula corresponding to the on-wafer calibration piece model may be determined according to equivalent circuits corresponding to different on-wafer calibration pieces.

Optionally, as shown in FIG. 5, when the on-wafer calibration piece is a load calibration piece, and the on-wafer calibration model is the third load calibration piece model, the admittance formula corresponding to the third load calibration piece model is:

$$\begin{cases} Y_{load}'' = \dfrac{1}{R_s + \dfrac{1}{Y_1 + Y_2}} \\ Y_1 = \dfrac{1}{R_1 + j\omega L_{load}} \\ Y_2 = j\omega C_s \end{cases},$$

where $Y_{load}''$ denotes the admittance of the load calibration piece; $R_1$ denotes a direct-current resistance of the load calibration piece; j denotes an imaginary number; ω denotes an angular frequency; $L_{load}$ denotes the load calibration piece inductance measured at a preset frequency, a low frequency referring to a frequency of 40 GHz or below; $R_s$ denotes the resistance that represents crosstalk of the load calibration piece; $C_s$ denotes the capacitance that represents crosstalk of the load calibration piece; $Y_1$ denotes a series admittance of $R_1$ and $L_{load}$; and $Y_2$ denotes a series admittance of $C_s$ and $R_s$.

Optionally, there may be $L_{load}$ according to FIG. 2. There may be $$L_{load} = \dfrac{Z_0(1 + S_{11}^{load})}{j\omega(1 - S_{11}^{load})} - \dfrac{R}{j\omega}$$

by calculation according to $$\begin{cases} S_{11}^{load} = \frac{Z_{load} - Z_0}{Z_{load} + Z_0} \\ Z_{load} = j\omega L_{load} + R \end{cases},$$

where $\omega=2\pi f$, $S_{11}^{load}$ denotes a load reflection coefficient of the end surface in FIG. 2; $Z_{load}$ denotes an input impedance of the load calibration piece; and R denotes the direct-current resistance of the load calibration piece.

Optionally, as shown in FIG. 9, when the on-wafer calibration piece is an open circuit calibration piece, and the on-wafer calibration model is the third open circuit calibration piece model, the admittance formula corresponding to the third open circuit calibration piece model is:

$$\begin{cases} Y''_{open} = \frac{1}{R'_s + \frac{1}{Y'_1 + Y'_2}} \\ Y'_1 = j\omega C_{open} \\ Y'_2 = j\omega C'_s \end{cases},$$

where $Y_{open}''$ denotes the admittance of the open circuit calibration piece; $C_{open}$ denotes the open circuit calibration piece capacitance, a low frequency referring to a frequency of 40 GHz or below; $R_s'$ denotes the resistance that represents crosstalk of the open circuit calibration piece; $C_s'$ denotes the capacitance that represents crosstalk of the open circuit calibration piece; $Y_1'$ denotes the admittance of $C_{open}$; and $Y_2'$ denotes a series admittance of $C_s'$ and $R_s'$.

Optionally, there may be $C_{open}$ according to FIG. 6. There may be $$C_{open} = \frac{1 - S_{11}^{open}}{j\omega Z_0 (1 + S_{11}^{open})}$$

by calculation according to $$\begin{cases} S_{11}^{open} = \frac{Z_{open} - Z_0}{Z_{open} + Z_0} \\ Z_{open} = \frac{1}{j\omega C_{open}} \end{cases},$$

where $S_{11}^{open}$ denotes an open circuit reflection coefficient of the end surface in FIG. 6, and $Z_{open}$ denotes an input impedance of the open circuit calibration piece in FIG. 6.

Optionally, as shown in FIG. 13, when the on-wafer calibration piece is a short circuit calibration piece, and the on-wafer calibration model is the third short circuit calibration piece model, the admittance formula corresponding to the third short circuit calibration piece model is:

$$\begin{cases} Y''_{short} = \frac{1}{R''_s + \frac{1}{Y''_1 + Y''_2}} \\ Y''_1 = \frac{1}{j\omega L_{short}} \\ Y''_2 = j\omega C''_s \end{cases},$$

where $Y_{short}''$ denotes the admittance of the short circuit calibration piece; $L_{short}$ denotes the short circuit calibration piece inductance measured at a preset frequency, the preset frequency referring to a frequency of 40 GHz and below; $R_s''$ denotes the resistance that represents crosstalk of the short circuit calibration piece; $C_s''$ denotes the capacitance that represents crosstalk of the short circuit calibration piece; $Y_1''$ denotes the admittance of $L_{short}$; and $Y_2''$ denotes a series admittance of $C_s''$ and $R_s''$.

Optionally, there may be $L_{short}$ according to FIG. 10. There may be $$L_{short} = \frac{Z_0(1 + S_{11}^{short})}{j\omega(1 - S_{11}^{short})}$$

by calculation according to $$\begin{cases} S_{11}^{short} = \frac{Z_{short} - Z_0}{Z_{short} + Z_0} \\ Z_{short} = j\omega L_{short} \end{cases},$$

where $\omega=2\pi f$, $S_{11}^{short}$ denotes a short circuit reflection coefficient of the end surface in FIG. 10, and $Z_{short}$ denotes an input impedance of the short circuit calibration piece in FIG. 10.

At step 105, a plurality of different parameters that represent crosstalk of the calibration piece in the on-wafer calibration piece model are calculated according to the admittance of the on-wafer calibration piece and the corresponding admittance formula.

Optionally, this step may include substituting the admittance of the on-wafer calibration piece into the corresponding admittance formula for calculation to obtain an impedance corresponding to the series admittance of the capacitance that represents the crosstalk of the calibration piece and the resistance that represents the crosstalk of the calibration piece. A real part of the impedance is the resistance that represents different crosstalk of the on-wafer calibration piece, and an imaginary part of the impedance is the capacitance that represents different crosstalk of the on-wafer calibration piece. That is, the parameters that represent different crosstalk of the calibration piece in the third load calibration piece model includes the resistance that represents crosstalk of the load calibration piece and the capacitance that represents crosstalk of the load calibration piece.

For example, when the on-wafer calibration piece is the load calibration piece, the calculated admittance of the load calibration piece may be $$Y = \frac{1 - S_{11}}{(1 + S_{11}) \cdot Z_0}.$$

It is substituted into the admittance formula corresponding to the third load calibration piece model for calculation to obtain an impedance corresponding to the admittance. This impedance is a complex number, the real part of which is $R_s$ and the imaginary part of which is $C_s$.

Similarly, an impedance corresponding to the series admittance of the capacitance that represents the crosstalk of the open circuit calibration piece and the resistance that represents the crosstalk of the open circuit calibration piece, and an impedance corresponding to the series admittance of the capacitance that represents the crosstalk of the short circuit calibration piece and the resistance that represents the crosstalk of the short circuit calibration piece may be obtained. The capacitance that represents the crosstalk of the open circuit calibration piece and the resistance that represents the crosstalk of the open circuit calibration piece, and the capacitance that represents the crosstalk of the short circuit calibration piece and the resistance that represents the crosstalk of the short circuit calibration piece may be further obtained.

It should be noted that in the above embodiment, the capacitance and the resistance that are obtained by calculating any one of the third load calibration piece model, the third open circuit calibration piece model, and the third short circuit calibration piece model and represent the crosstalk of the calibration piece may also be applied to other models. For example, the capacitance and the resistance that are obtained by calculating the third load calibration piece model and represent the crosstalk of the calibration piece may also be applied to the third open circuit calibration piece model and the third short circuit calibration piece model; the capacitance and the resistance that are obtained by calculating the third open calibration piece model and represent the crosstalk of the calibration piece may also be applied to the third load calibration piece model and the third short circuit calibration piece model; and the capacitance and the resistance that are obtained by calculating the third short circuit calibration piece model and represent the crosstalk of the calibration piece may also be applied to the third load calibration piece model and the third open circuit calibration piece model. During calibration of a calibration piece, one calibration model may be used to obtain a corresponding capacitance and resistance that represent the crosstalk of the calibration piece, and the capacitance and the resistance may be applied to other calibration piece models, without calculating capacitances and resistances that correspond to other calibration models and represent crosstalk of the calibration piece, so that the calibration time can be saved, and the generality of the on-wafer calibration piece model can be improved.

In the method for determining the parameters in the on-wafer calibration piece model, the on-wafer calibration piece model used in the Terahertz frequency band is provided. In the Terahertz frequency band, the multi-thread TRL calibration method is used to calibrate the on-wafer S parameter measurement system, and the calibrated on-wafer S parameter measurement system is used for measurement, thus obtaining the S parameter of the on-wafer calibration piece; the admittance of the on-wafer calibration piece is calculated according to the S parameter of the on-wafer calibration piece; the admittance formula corresponding to the on-wafer calibration piece model is determined according to the on-wafer calibration piece model corresponding to the on-wafer calibration piece; and the plurality of different parameters that represent crosstalk of the calibration piece in the on-wafer calibration piece model are calculated according to the admittance of the on-wafer calibration piece and the corresponding admittance formula. The on-wafer calibration piece model provided by the present embodiment solves calibration and measurement errors caused by imperfection of the original on-wafer calibration piece model in the terahertz frequency band and improves the test accuracy of the on-wafer S parameters in the terahertz frequency band. In addition, the present embodiment further provides a method for calculating parameters in different on-wafer calibration piece models.

The above-mentioned embodiments are only used to illustrate the technical solutions of the present application, not intended to limit them. Although the present application has been described in detail with reference to the foregoing embodiments, those of ordinary skill in the art should understand that they still can modify the technical solutions recorded in all the foregoing embodiments, or replace partial technical features by equivalences. These modifications or replacements do not cause the essences of the corresponding technical solutions to depart from the spirit and scope of the technical solutions of all the embodiments of the present application, and shall fall within the protection scope of the present application.

The invention claimed is:

1. A method comprising:
constructing an on-wafer calibration piece model set, the on-wafer calibration piece model set comprising one or more on-wafer calibration piece models used in a Terahertz frequency band, wherein each of the one or more on-wafer calibration piece models has a corresponding on-wafer calibration piece;
selecting an on-wafer calibration piece model from the on-wafer calibration piece model set;
in the Terahertz frequency band, using a multi-thread Thru-Reflect-Line (TRL) calibration method to calibrate an on-wafer S parameter measurement system and obtaining a calibrated on-wafer S parameter measurement system, using the calibrated on-wafer S parameter measurement system to measure the on-wafer calibration piece of the selected on-wafer calibration piece model, and obtaining an S parameter of the on-wafer calibration piece;
calculating an admittance of the on-wafer calibration piece according to the S parameter of the on-wafer calibration piece;
determining, according to the on-wafer calibration piece model, an admittance formula corresponding to the on-wafer calibration piece model;
calculating, according to the admittance and the admittance formula, a target parameter in the on-wafer calibration piece model, the target parameter representing crosstalk of the on-wafer calibration piece of the selected on-wafer calibration piece model; and
calibrating, using the on-wafer calibration piece of the selected on-wafer calibration piece model having the target parameter, an on-wafer S parameter measurement system to be calibrated; and
wherein constructing the on-wafer calibration piece model set comprises:
connecting, in parallel, a circuit to two ends of an end surface in an original calibration piece model, the circuit being formed by connecting, in series, two elements that represent the crosstalk of the on-wafer calibration piece, and wherein:
the one or more on-wafer calibration piece models comprise a first load calibration piece model, a first open circuit calibration piece model, and a first short circuit calibration piece model;
the corresponding on-wafer calibration piece of the first load calibration piece model is a first load calibration piece;
the corresponding on-wafer calibration piece of the first open circuit calibration piece model is a first open circuit calibration piece;
the corresponding on-wafer calibration piece of the first short circuit calibration piece model is a first short circuit calibration piece;

the first load calibration piece model comprises a load calibration piece inductor, a load calibration piece direct-current resistor, a first resistor and a first capacitor, wherein both the first resistor and the first capacitor represent crosstalk of the first load calibration piece; a first end of the load calibration piece inductor is connected to a first end of the first resistor to form a first end of a single port of the first load calibration piece model; and a second end of the load calibration piece inductor is connected to a first end of the load calibration piece direct-current resistor, a second end of the first resistor is connected to a first end of the first capacitor, and a second end of the first capacitor is connected to a second end of the load calibration piece direct-current resistor, to form a second end of the single port of the first load calibration piece model;

the first open circuit calibration piece model comprises an open circuit calibration piece capacitor, a second resistor and a second capacitor, wherein both the second resistor and the second capacitor represent crosstalk of the first open circuit calibration piece; a first end of the open circuit calibration piece capacitor is connected to a first end of the second resistor, to form a first end of a single port of the first open circuit calibration piece model; and a second end of the second resistor is connected to a first end of the second capacitor, and a second end of the second capacitor is connected to a second end of the open circuit calibration piece capacitor, to form a second end of the single port of the first open circuit calibration piece model; and the first short circuit calibration piece model comprises a short circuit calibration piece inductor, a third resistor and a third capacitor, wherein both the third resistor and the third capacitor represent crosstalk of the first short circuit calibration piece; a first end of the short circuit calibration piece inductor is connected to a first end of the third resistor, to form a first end of a single port of the first short circuit calibration piece model; and a second end of the third resistor is connected to a first end of the third capacitor, and a second end of the third capacitor is connected to a second end of the short circuit calibration piece inductor, to form a second end of the single port of the first short circuit calibration piece model.

2. The method according to claim 1, wherein calculating the admittance of the on-wafer calibration piece according to the S parameter comprises:
calculating the admittance of the on-wafer calibration piece according to following formula:

$$\begin{cases} S_{11} = \dfrac{Z_{open} - Z_0}{Z_{open} + Z_0} \\ Y = \dfrac{1}{Z_{open}} \end{cases},$$

wherein $S_{11}$ denotes the S parameter of the on-wafer calibration piece, Y denotes the admittance of the on-wafer calibration piece, $Z_{open}$ denotes an impedance of the first open circuit calibration piece, and $Z_0$ denotes a system feature impedance.

3. The method according to claim 1, wherein determining, according to the on-wafer calibration piece model, the admittance formula corresponding to the on-wafer calibration piece model comprises:
when the on-wafer calibration piece model is the first load calibration piece model and the corresponding on-wafer calibration piece is the first load calibration piece, determining that the admittance formula is:

$$\begin{cases} Y_{load} = Y_1 + Y_2 \\ Y_1 = \dfrac{1}{R_1 + j\omega L_{load}} \\ Y_2 = \dfrac{1}{R_s + \dfrac{1}{j\omega C_s}} \end{cases},$$

wherein $Y_{load}$ denotes an admittance of the first load calibration piece, $R_1$ denotes a resistance of the load calibration piece direct-current resistor, j denotes an imaginary number, ω denotes an angular frequency, $L_{load}$ denotes a inductance of the load calibration piece inductor measured at a preset frequency, $R_s$ denotes a resistance of the first resistor, $C_s$ denotes capacitance of the first capacitor, $Y_1$ denotes a series admittance of $R_1$ and $L_{load}$, and $Y_2$ denotes a series admittance of $C_s$ and $R_s$.

4. The method according to claim 1, wherein determining, according to the on-wafer calibration piece model, the admittance formula corresponding to the on-wafer calibration piece model comprises:
when the on-wafer calibration piece model is the first open circuit calibration piece model and the corresponding on-wafer calibration piece is the first open circuit calibration piece, determining that the admittance formula is:

$$\begin{cases} Y_{open} = Y_1' + Y_2' \\ Y_1' = j\omega C_{open} \\ Y_2' = \dfrac{1}{R_s' + \dfrac{1}{j\omega C_s'}} \end{cases},$$

wherein $Y_{open}$ denotes an admittance of the first open circuit calibration piece, $C_{open}$ denotes a capacitance of the open circuit calibration piece capacitor measured at a preset frequency, $R_s'$ denotes a resistance of the second resistor, $C_s'$ denotes a capacitance of the second capacitor, $Y_1'$ denotes an admittance of $C_{open}$, and $Y_2'$ denotes a series admittance of $C_s'$ and $R_s'$.

5. The method according to claim 1, wherein determining, according to the on-wafer calibration piece model, the admittance formula corresponding to the on-wafer calibration piece model comprises:
when the on-wafer calibration piece model is the first short circuit calibration piece model and the corresponding on-wafer calibration piece is the first short circuit calibration piece, determining that the admittance formula is:

$$\begin{cases} Y_{short} = Y_1'' + Y_2'' \\ Y_1'' = \dfrac{1}{j\omega L_{short}} \\ Y_2'' = \dfrac{1}{R_s'' + \dfrac{1}{j\omega C_s''}} \end{cases},$$

wherein $Y_{short}$ denotes an admittance of the first short circuit calibration piece, $L_{short}$ denotes an inductance of the short circuit calibration piece inductor measured at a preset frequency, $R_s''$ denotes a resistance of the third resistor, $C_s''$ denotes a capacitance of the third capacitor, $Y_1''$ denotes an admittance of $L_{short}$, and $Y_2''$ denotes a series admittance of $C_s''$ and $R_s''$.

6. The method according to claim 1, wherein the target parameter comprises a target capacitance and a target resistance, and calculating, according to the admittance and the admittance formula, the target parameter in the on-wafer calibration piece model comprises:
   substituting the admittance into the admittance formula for calculation to obtain an intermediate impedance, the intermediate impedance being a series impedance or a parallel impedance, wherein the series impedance is an impedance corresponding to a series admittance of the target capacitance and the target resistance, and the parallel impedance is an impedance corresponding to a parallel admittance of the target capacitance and the target resistance; and wherein a real part of the intermediate impedance is the target resistance, and an imaginary part of the intermediate impedance is the target capacitance.

7. A method comprising:
   constructing an on-wafer calibration piece model set, the on-wafer calibration piece model set comprising one or more on-wafer calibration piece models used in a Terahertz frequency band, wherein each of the one or more on-wafer calibration piece models has a corresponding on-wafer calibration piece;
   selecting an on-wafer calibration piece model from the on-wafer calibration piece model set;
   in the Terahertz frequency band, using a multi-thread Thru-Reflect-Line (TRL) calibration method to calibrate an on-wafer S parameter measurement system and obtaining a calibrated on-wafer S parameter measurement system, using the calibrated on-wafer S Parameter measurement system to measure the on-wafer calibration piece of the selected on-wafer calibration piece model, and obtaining an S parameter of the on-wafer calibration piece;
   calculating an admittance of the on-wafer calibration piece according to the S parameter of the on-wafer calibration piece;
   determining, according to the on-wafer calibration piece model, an admittance formula corresponding to the on-wafer calibration piece model;
   calculating, according to the admittance and the admittance formula, a target parameter in the on-wafer calibration piece model, the target parameter representing crosstalk of the on-wafer calibration piece of the selected on-wafer calibration piece model; and
   calibrating, using the on-wafer calibration piece of the selected on-wafer calibration piece model having the target parameter, an on-wafer S parameter measurement system to be calibrated; and wherein constructing the on-wafer calibration piece model set comprises:
   connecting, in parallel, two elements that represent the crosstalk of the on-wafer calibration piece to two ends of an end surface in an original calibration piece model, and wherein:
   the on-wafer calibration piece model set comprises a second load calibration piece model, a second open circuit calibration piece model, and a second short circuit calibration piece model;
   the corresponding on-wafer calibration piece of the second load calibration piece model is a second load calibration piece;
   the corresponding on-wafer calibration piece of the second open circuit calibration piece model is a second open circuit calibration piece;
   the corresponding on-wafer calibration piece of the second short circuit calibration piece model is a second short circuit calibration piece;
   the second load calibration piece model comprises a load calibration piece inductor, a load calibration piece direct-current resistor, a fourth resistor and a fourth capacitor, wherein both the fourth resistor and the fourth capacitor represent crosstalk of the second load calibration piece; a first end of the load calibration piece inductor is connected to a first end of the fourth resistor and a first end of the fourth capacitor, to form a first end of a single port of the second load calibration piece model; and a second end of the load calibration piece inductor is connected to a first end of the load calibration piece direct-current resistor, a second end of the load calibration piece direct-current resistor is connected to a second end of the fourth resistor and a second end of the fourth capacitor, to form a second end of the single port of the second load calibration piece model;
   the second open circuit calibration piece model comprises an open circuit calibration piece capacitor, a fifth resistor and a fifth capacitor, wherein both the fifth resistor and the fifth capacitor represent crosstalk of the second open circuit calibration piece; a first end of the open circuit calibration piece capacitor is connected to a first end of the fifth resistor and a first end of the fifth capacitor, to form a first end of a single port of the second open circuit calibration piece model; and a second end of the open circuit calibration piece capacitor is connected to a second end of the fifth resistor and a second end of the fifth capacitor, to form a second end of the single port of the second open circuit calibration piece model; and
   the second short circuit calibration piece model comprises a short circuit calibration piece inductor, a sixth resistor and a sixth capacitor, wherein both the sixth resistor and the sixth capacitor represent crosstalk of the second short circuit calibration piece; a first end of the short circuit calibration piece inductor is connected to a first end of the sixth resistor and a first end of the sixth capacitor, to form a first end of a single port of the second short circuit calibration piece model; and a second end of the short circuit calibration piece inductor is connected to a second end of the sixth resistor and a second end of the sixth capacitor, to form a second end of the single port of the second short circuit calibration piece model.

8. The method according to claim 7, wherein determining, according to the on-wafer calibration piece model, the admittance formula corresponding to the on-wafer calibration piece model comprises:

when the on-wafer calibration piece model is the second load calibration piece model and the corresponding on-wafer calibration piece is the second load calibration piece, determining that the admittance formula is:

$$\begin{cases} Y'_{load} = Y_1 + Y_2 + Y_3 \\ Y_1 = \dfrac{1}{R_1 + j\omega L_{load}} \\ Y_2 = j\omega C_s \\ Y_3 = \dfrac{1}{R_s} \end{cases},$$

wherein $Y_{load}'$ denotes an admittance of the second load calibration piece, $R_1$ denotes a resistance of the load calibration piece direct-current resistor, j denotes an imaginary number, ω denotes an angular frequency, $L_{load}$ denotes an inductance of the load calibration piece inductor measured at a preset frequency, $R_s$ denotes a resistance of the fourth resistor, $C_s$ denotes capacitance of the fourth capacitor, $Y_1$ denotes a series admittance of $R_1$ and $L_{load}$, $Y_2$ denotes an admittance of $C_s$, and $Y_3$ denotes the admittance of $R_s$.

9. The method according to claim 7, wherein determining, according to the on-wafer calibration piece model, the admittance formula corresponding to the on-wafer calibration piece model comprises:

when the on-wafer piece calibration model is the second open circuit calibration piece model and the corresponding on-wafer calibration piece is the second open circuit calibration piece, determining that the admittance formula is:

$$\begin{cases} Y'_{open} = Y'_1 + Y'_2 + Y'_3 \\ Y'_1 = j\omega C_{open} \\ Y'_2 = j\omega C'_s \\ Y'_3 = \dfrac{1}{R'_s} \end{cases},$$

wherein $Y_{open}'$ denotes an admittance of the second open circuit calibration piece, $C_{open}$ denotes a capacitance of the open circuit calibration piece capacitor measured at a preset frequency, $R_s'$ denotes resistance of the fifth resistor, $C_s'$ denotes a capacitance of the fifth capacitor, $Y_1'$ denotes an admittance of $C_{open}$, $Y_2'$ denotes an admittance of $C_s'$, and $Y_3'$ denotes an admittance of $R_s'$.

10. The method according to claim 7, wherein determining, according to the on-wafer calibration piece model, the admittance formula corresponding to the on-wafer calibration piece model comprises:

when the on-wafer calibration piece model is the second short circuit calibration piece model and the corresponding on-wafer calibration piece is the second short circuit calibration piece, determining that the admittance formula is:

$$\begin{cases} Y'_{short} = Y''_1 + Y''_2 + Y''_3 \\ Y''_1 = \dfrac{1}{j\omega L_{short}} \\ Y''_2 = j\omega C''_s \\ Y''_3 = \dfrac{1}{R''_s} \end{cases},$$

wherein $Y_{short}'$ denotes an admittance of the second short circuit calibration piece, $L_{short}$ denotes an inductance of the short circuit calibration piece inductor measured at a preset frequency, $R_s''$ denotes a resistance of the sixth resistor, $C_s''$ denotes a capacitance of the sixth capacitor, $Y_1''$ denotes an admittance of $L_{short}$, $Y_2''$ if denotes an admittance of $C_s''$, and $Y_3''$ denotes an admittance of $R_s''$.

11. A method comprising:
constructing an on-wafer calibration piece model set, the on-wafer calibration piece model set comprising one or more on-wafer calibration piece models used in a Terahertz frequency band, wherein each of the one or more on-wafer calibration piece models has a corresponding on-wafer calibration piece;
selecting an on-wafer calibration piece model from the on-wafer calibration piece model set;
in the Terahertz frequency band, using a multi-thread Thru-Reflect-Line (TRL) calibration method to calibrate an on-wafer S parameter measurement system and obtaining a calibrated on-wafer S parameter measurement system, using the calibrated on-wafer S parameter measurement system to measure the on-wafer calibration piece of the selected on-wafer calibration piece model, and obtaining an S parameter of the on-wafer calibration piece;
calculating an admittance of the on-wafer calibration piece according to the S parameter of the on-wafer calibration piece;
determining, according to the on-wafer calibration piece model, an admittance formula corresponding to the on-wafer calibration piece model;
calculating, according to the admittance and the admittance formula, a target parameter in the on-wafer calibration piece model, the target parameter representing crosstalk of the on-wafer calibration piece of the selected on-wafer calibration piece model; and
calibrating, using the on-wafer calibration piece of the selected on-wafer calibration piece model having the target parameter, an on-wafer S parameter measurement system to be calibrated; and
wherein constructing the on-wafer calibration piece model set comprising:
connecting a resistor and a capacitor to an original calibration piece model of a corresponding on-wafer calibration piece model, and wherein:
both the resistor and the capacitor represent the crosstalk of the on-wafer calibration piece of the corresponding on-wafer calibration piece model;
the resistor is connected in series to a circuit including elements in the original calibration piece model;
a first end of the capacitor is connected between the resistor and a first end of the circuit including the elements in the original calibration piece model; and
a second end of the capacitor is connected to a second end of the circuit including the elements in the original calibration piece model.

12. The method according to claim 11, wherein the original calibration piece model is an original load calibration piece model, an original open circuit calibration piece model, or an original short circuit calibration piece model;

the original load calibration piece model comprises a load calibration piece inductor and a load calibration piece direct-current resistor; the original open circuit calibration piece model comprises an open circuit calibration piece capacitor; the original short circuit calibration piece model comprises a short circuit calibration piece inductor;

the one or more on-wafer calibration piece models comprise a third load calibration piece model, a third open circuit calibration piece model, and a third short circuit calibration piece model;

the corresponding on-wafer calibration piece of the third load calibration piece model is a third load calibration piece;

the corresponding on-wafer calibration piece of the third open circuit calibration piece model is a third open circuit calibration piece;

the corresponding on-wafer calibration piece of the third short circuit calibration piece model is a third short circuit calibration piece;

for the third load calibration piece model, the original calibration piece model is the original load calibration piece model, the resistor is a seventh resistor and the capacitor is a seventh capacitor; the third load calibration piece model comprises the seventh resistor and the seventh capacitor, wherein a first end of the seventh resistor is connected to a first end of the seventh capacitor and a first end of the load calibration piece inductor; a second end of the seventh resistor forms a first end of a single port of the third load calibration piece model; and a second end of the load calibration piece inductor is connected to a first end of the load calibration piece direct-current resistor, and a second end of the load calibration piece direct-current resistor is connected to a second end of the seventh capacitor, to form a second end of the single port of the third load calibration piece model; or a first end of the seventh capacitor is connected to a first end of the load calibration piece inductor, to form a first end of a single port of the third load calibration piece model; a second end of the load calibration piece inductor is connected to a first end of the load calibration piece direct-current resistor, and a second end of the load calibration piece direct-current resistor is connected to a second end of the seventh capacitor and a first end of the seventh resistor; and a second end of the seventh resistor forms a second end of the single port of the third load calibration piece model;

for the third open circuit calibration piece model, the original calibration piece model is the original open circuit calibration piece model, the resistor is an eighth resistor and the capacitor is an eighth capacitor; and the third open circuit calibration piece model comprises the eighth resistor and the eighth capacitor, wherein a first end of the eighth resistor forms a first end of a single port of the third open circuit calibration piece model; a second end of the eighth resistor is connected to a first end of the open circuit calibration piece capacitor and a first end of the eighth capacitor, and a second end of the open circuit calibration piece capacitor is connected to a second end of the eighth capacitor, to form a second end of the single port of the third open circuit calibration piece model; or a first end of the open circuit calibration piece capacitor is connected to a first end of the eighth capacitor, to form a first end of a single port of the third open circuit calibration piece model; a second end of the open circuit calibration piece capacitor and a second end of the eighth capacitor are connected to a first end of the eighth resistor; and a second end of the eighth resistor forms a second end of the single port of the third open circuit calibration piece model; and for the third short circuit calibration piece model, the original calibration piece model is the original short circuit calibration piece model, the resistor is a ninth resistor and the capacitor is a ninth capacitor; and the third short circuit calibration piece model comprises the ninth resistor and the ninth capacitor, wherein a first end of the ninth resistor forms a first end of a single port of the third short circuit calibration piece model; a second end of the ninth resistor is connected to a first end of the short circuit calibration piece inductor and a first end of the ninth capacitor, and a second end of the short circuit calibration piece inductor is connected to a second end of the ninth capacitor, to form a second end of the single port of the third short circuit calibration piece model; or a first end of the short circuit calibration piece inductor is connected to a first end of the ninth capacitor, to form a first end of a single port of the third short circuit calibration piece model; a second end of the short circuit calibration piece inductor and a second of the ninth capacitor are connected to a first end of the ninth resistor; and a second end of the ninth resistor forms a second end of the single port of the third short circuit calibration piece model.

13. The method according to claim 12, wherein determining, according to the on-wafer calibration piece model, the admittance formula corresponding to the on-wafer calibration piece model comprises:

when the on-wafer calibration piece is the third load calibration piece, and the on-wafer calibration piece model is the third load calibration piece model, determining that the admittance formula is:

$$\begin{cases} Y''_{load} = \dfrac{1}{R_s + \dfrac{1}{Y_1 + Y_2}} \\ Y_1 = \dfrac{1}{R_1 + j\omega L_{load}} \\ Y_2 = j\omega C_s \end{cases},$$

wherein $Y_{load}''$ denotes an admittance of the third load calibration piece, $R_1$ denotes a resistance of the load calibration piece direct-current resistor, j denotes an imaginary number, $\omega$ denotes an angular frequency, $L_{load}$ denotes an inductance of the load calibration piece inductor measured at a preset frequency, $R_s$ denotes a resistance of the seventh resistor, $C_s$ denotes a capacitance of the seventh capacitor, $Y_1$ denotes a series admittance of $R_1$ and $L_{load}$, and $Y_2$ denotes an admittance of $C_s$.

14. The method according to claim 12, wherein determining, according to the on-wafer calibration piece model, the admittance formula corresponding to the on-wafer calibration piece model comprises:

when the on-wafer calibration piece is the third open circuit calibration piece, and the on-wafer calibration piece model is the third open circuit calibration piece model, determining that the admittance formula is:

$$\begin{cases} Y''_{open} = \dfrac{1}{R'_s + \dfrac{1}{Y'_1 + Y'_2}} \\ Y'_1 = j\omega C_{open} \\ Y'_2 = j\omega C'_s \end{cases},$$

wherein $Y_{open}''$ denotes an admittance of the third open circuit calibration piece, $C_{open}$ denotes a capacitance of the open circuit calibration piece capacitor measured at a preset frequency, $R_s'$ denotes a resistance of the eighth resistor, $C_s'$ denotes a capacitance of the eighth capacitor, $Y_1'$ denotes an admittance of $C_{open}$, and $Y_2'$ denotes an admittance of $C_s'$.

15. The method according to claim 12, wherein determining, according to the on-wafer calibration piece model, the admittance formula corresponding to the on-wafer calibration piece model comprises:

when the on-wafer calibration piece is the third short circuit calibration piece, and the on-wafer calibration piece model is the third short circuit calibration piece model, determining that the admittance formula is:

$$\begin{cases} Y''_{short} = \dfrac{1}{R''_s + \dfrac{1}{Y''_1 + Y''_2}} \\ Y''_1 = \dfrac{1}{j\omega L_{short}} \\ Y''_2 = j\omega C''_s \end{cases},$$

wherein $Y_{short}''$ denotes an admittance of the third short circuit calibration piece, $L_{short}$ denotes an inductance of the short circuit calibration piece inductor measured at a preset frequency, $R_s''$ denotes a resistance of the ninth resistor, $C_s''$ denotes a capacitance of the ninth capacitor, $Y_1''$ denotes an admittance of $L_{short}$, and $Y_2''$ denotes an admittance of $C_s''$.

* * * * *